United States Patent [19]
Mori et al.

[11] Patent Number: 6,127,240
[45] Date of Patent: Oct. 3, 2000

[54] METHOD OF MANUFACTURING A SEMICONDUCTOR DEVICE HAVING A CAPACITOR

[75] Inventors: Kiyoshi Mori; Junichi Tsuchimoto, both of Hyogo, Japan

[73] Assignee: Mitsubishi Denki Kabushiki Kaisha, Tokyo, Japan

[21] Appl. No.: 09/004,280

[22] Filed: Jan. 8, 1998

Related U.S. Application Data

[62] Division of application No. 08/648,461, May 15, 1996, Pat. No. 5,798,290.

[30] Foreign Application Priority Data

Nov. 6, 1995 [JP] Japan .................................. 7-287427

[51] Int. Cl.[7] .................................................. H01L 21/20
[52] U.S. Cl. .......................... 438/398; 438/255; 438/396
[58] Field of Search ................................... 438/246, 255, 438/260, 389, 398, 527, 528, 396

[56] References Cited

U.S. PATENT DOCUMENTS

| | | | |
|---|---|---|---|
| 4,682,404 | 7/1987 | Miller et al. | 29/571 |
| 5,037,773 | 8/1991 | Lee et al. | 438/255 |
| 5,087,583 | 2/1992 | Hazani | 438/260 |
| 5,223,445 | 6/1993 | Fuse | 438/302 |
| 5,290,729 | 3/1994 | Hayashide et al. | 438/255 |
| 5,405,801 | 4/1995 | Han et al. | 438/386 |
| 5,597,754 | 1/1997 | Lou et al. | 438/398 |
| 5,661,340 | 8/1997 | Ema et al. | 257/680 |
| 5,759,894 | 6/1998 | Tseng et al. | 438/255 |
| 5,773,342 | 6/1998 | Fukase | 438/255 |

FOREIGN PATENT DOCUMENTS

| | | |
|---|---|---|
| 3-234051 | 10/1991 | Japan . |
| 6-13566 | 1/1994 | Japan . |

OTHER PUBLICATIONS

Watanabe et al., "An Advanced Fabrication Technology of Hemispherical Grained (HSG) Poly–Si for High Capacitance Storage Electrodes" *Extended Abstracts of the 1991 International Conference on Solid State Devices and Materials*, Yokohama, 1991, pp. 478–480.

*Primary Examiner*—Carl Whitehead, Jr.
*Assistant Examiner*—Jeff Vockrodt

[57] ABSTRACT

A polysilicon film having a rough surface is formed by a reduced pressure CVD method at a temperature of 575° C. and a deposition pressure of 0.2 Torr. Silicon ions are implanted into the polysilicon film having a rough surface. Thus, the tips of concaves and convexes at the rough surface of the polysilicon film are rounded. Then, this polysilicon film having a rough surface is patterned to form a storage node. A cell plate is formed to cover the storage node with a capacitor insulating layer therebetween. Consequently, a semiconductor device capable of suppressing leak current between capacitor electrodes can be manufactured.

2 Claims, 9 Drawing Sheets

1000Å

1000Å

METHOD OF MANUFACTURING A SEMICONDUCTOR DEVICE HAVING A CAPACITOR

This application is a Divisional of application Ser. No. 08/648,461 filed May 15, 1996, U.S. Pat. No. 5,798,290.

BACKGROUND OF THE INVENTION

1. Field of the Invention

The present invention relates to a method of manufacturing a semiconductor device having a capacitor, and more particularly, to a method of manufacturing a capacitor electrode of a semiconductor integrated device represented by a storage apparatus and an information processor.

2. Description of the Background Art

With increase in integration degree of a DRAM (Dynamic Random Access Memory), a three-dimensional structure of a capacitor has been increasingly produced in order to secure sufficient capacitance thereof in limited space. Such a capacitor structure includes a fin type structure, a crown type (cylinder type) structure and the like.

Furthermore, a technique to form fine concaves and convexes at a surface of a storage node electrode (a lower electrode of a capacitor) formed of a polycrystalline silicon film so as to increase surface area has been proposed. Polycrystalline silicon therein is called polysilicon having a rough surface (hereinafter referred to as rough surface polysilicon) from the surface condition thereof.

Concaves and convexes are formed at a surface of a storage node by a technique described in, for example, H. Watanabe et al., "An Advanced Fabrication Technology of Hemispherical Grained (HSG) Poly-Si for High Capacitance Storage Electrodes", Extended Abstracts of the 1991 International Conference on Solid State Devices and Materials, Yokohama, 1991, pp. 478–480. A method of manufacturing a capacitor of a DRAM memory cell using this technique will now be described as a conventional method of manufacturing a semiconductor device.

FIGS. 11 to 15 are schematic cross sections sequentially showing the steps of a conventional method of manufacturing a semiconductor device having a capacitor.

First, referring to FIG. 11, a patterned gate electrode layer 7 is formed on a p type silicon substrate 1 with a gate insulating layer 5 therebetween. A pair of $n^-$ impurity regions 3a are formed at a prescribed distance away from each other so as to sandwich a region under gate electrode layer 7 therebetween, by ion implantation or the like using gate electrode layer 7 as a mask. An insulating layer 11 which covers gate electrode layer 7 is formed thereafter. A pair of $n^+$ impurity regions 3b are formed at a surface of p type silicon substrate 1 by ion implantation or the like using insulating layer 11 as a mask. An n type source/drain regions 3 having an LDD (Lightly Doped Drain) structure is formed of n impurity region 3a and $n^+$ impurity region 3b.

An MOS (Metal Oxide Semiconductor) is constituted by the pair of n type source/drain regions 3, gate insulating film 5 and gate electrode layer 7.

Referring to FIG. 12, an interlayer insulating layer 13 made of a silicon oxide film or the like is formed to cover an MOS transistor 10. A resist pattern 31 is formed on interlayer insulating layer 13 by normal photolithography technique. Interlayer insulating layer 13 is subject to anisotropic etching using resist pattern 31 as a mask. A contact hole 13a reaching to a partial surface of n type source/drain region 3 is formed by this anisotropic etching. Resist pattern 31 is then removed.

Referring to FIG. 13, a rough surface polysilicon layer 15a is formed under the conditions in the above article so as to be electrically connected to n type source/drain region 3 through contact hole 13a and to extend over interlayer insulating layer 13. More specifically, the rough surface polysilicon is formed by an LPCVD (Low Pressure Chemical Vapor Deposition) method using gas containing 20% silane ($SiH_4$) at 1.0 Torr and a temperature of 590° C.

Referring to FIG. 14, a resist pattern 33 having a desired shape is formed on rough surface polysilicon 15a by normal photolithography technique. Rough surface polysilicon 15a is subject to anisotropic etching using this resist pattern 33 as a mask.

Referring to FIG. 15, the rough surface polysilicon is patterned by this anisotropic etching. Thus, a storage node (lower electrode) 15 which is electrically connected to n type source/drain region 3 through contact hole 13a and extends on interlayer insulating layer 13 is formed. A capacitor insulating layer 17 is formed to cover storage node 15. Since capacitor insulating layer 17 is formed relatively thin, a surface of capacitor insulating layer 17 on storage node 15 has concaves and convexes which reflect the shape of concaves and convexes at the surface of storage node 15. A cell plate (upper electrode) 19 is formed to be opposite to storage node 15 through capacitor insulating layer 17.

A capacitor 20 is constituted by storage node 15, capacitor insulating layer 17 and cell plate 19.

Thus, a DRAM memory cell with a single-transistor/single-capacitor structure formed of MOS transistor 10 and capacitor 20 is completed.

Since the storage node formed as described above has concaves and convexes at a surface thereof, this storage node is characterized in that area in which storage node 15 and cell plate 19 are opposite to each other, per area occupied by a capacitor can be increased.

It is known, however, that as to a property of a thin capacitor insulating layer formed on a rough surface polysilicon, leak current between capacitor electrodes is somewhat increased as shown in FIG. 16 compared to the case of a polysilicon layer having a flat surface.

A method of measuring leak current mentioned above will now be described.

FIG. 17 is a cross section showing a structure of a sample used to measure leak current. Referring to FIG. 17, an interlayer insulating layer 13 having a contact hole 13a is formed on a silicon substrate 1. A storage node 15 is formed to be connected to silicon substrate 1 through contact hole 13a. A cell plate 19 is formed to be opposite to storage node 15 with a capacitor insulating layer 17 therebetween.

With cell plate 19 used as one electrode and silicon substrate 1 as the other electrode, leak current (the ordinate of FIG. 16) with respect to voltage (the abscissa of FIG. 16) applied therebetween was measured.

In addition, respective voltage resistances of capacitors in which a polysilicon layer having a relatively flat surface, a polysilicon layer having a surface with relatively rounded tips of convexes, and a polysilicon layer having a surface with relatively acute-angled tips of convexes were respectively used as a storage node 15 were measured under the same conditions. As a result, voltage resistance was 3.17 V for a capacitor using a polysilicon layer having a relatively flat surface, 2.8 V for a capacitor using a polysilicon layer having a surface with relatively rounded tips of convexes, and 2.29 V for a capacitor using a polysilicon layer having a surface with relatively acute-angled tips of convexes.

Consequently, it has been found that acuter-angled (more needle-like) tips of convexes at a surface having concaves and convexes cause larger increase (degradation) in leak current. It can be considered that this increase in leak current results from concentration of an electric field caused by a shape of a surface of polysilicon. More specifically, it can be considered that acute-angled tips of convexes tend to facilitate concentration of an electric field on those tips, causing leak current.

SUMMARY OF THE INVENTION

It is an object of the present invention to provide a method of manufacturing a semiconductor device capable of suppressing leak current between capacitor electrodes.

In view of the mechanism of increase in leak current described above, it can be considered to be effective to deform the shape of concaves and convexes from a needle-like shape to rounded one. Accordingly, a method of rounding acute-angled portions of the tips of concaves and convexes is proposed in the present invention. More specifically, the present invention is characterized in that concaves and convexes with acute-angled tips of polysilicon are deformed to rounded convexes and concaves by applying ion implantation to the polysilicon having concaves and convexes with acute-angled tips.

Therefore, a method of manufacturing a semiconductor device in accordance with one aspect of the present invention is a method of manufacturing a semiconductor device having a capacitor formed of a pair of electrode layers which are opposite to each other with an insulating layer therebetween, and includes the following steps.

First, a lower electrode layer of a capacitor, which has a surface with concaves and convexes, is formed of polycrystalline silicon. Then, the tips of concaves and convexes at the surface of the lower electrode layer are rounded by ion implantation of silicon into the lower electrode layer. An upper electrode layer is formed on the surface of the lower electrode layer with a capacitor insulating layer therebetween.

In the method of manufacturing a semiconductor device in accordance with the above mentioned one aspect of the present invention, the tips of concaves and convexes at the surface of the lower electrode layer are rounded by ion implantation of silicon into the lower electrode layer. Thus, concentration of an electric field on the tips of concaves and convexes is prevented. Therefore, increase in leak current can be suppressed.

A method of manufacturing a semiconductor device in accordance with another aspect of the present invention is a method of manufacturing a semiconductor device having a capacitor formed of a pair of electrode layers which are opposite to each other with an insulating layer therebetween, and includes the following steps.

First, a lower electrode layer of a capacitor, which has a surface with concaves and convexes, is formed of polycrystalline silicon. Then, the tips of concaves and convexes at the surface of the lower electrode layer are rounded by ion implantation of at least any one of phosphorus and arsenic into the lower electrode layer with a dose of less than $3.0 \times 10^{15}$ cm$^{-2}$. Thereafter, an upper electrode layer is formed on the surface of the lower electrode layer with a capacitor insulating layer therebetween.

In the method of manufacturing a semiconductor device in accordance with the above mentioned another aspect of the present invention, the tips of concaves and convexes of the lower electrode layer are rounded by ion implantation of at least any one of phosphorus and arsenic into the lower electrode layer. Therefore, concentration of an electric field on the tips of concaves and convexes is prevented. Consequently, increase in leak current between capacitor electrodes can be suppressed.

Furthermore, since at least any one of phosphorus and arsenic is ion-implanted with a dose of less than $3.0 \times 10^{15}$ cm$^{-2}$, a prescribed shape of concaves and convexes at the surface of the lower electrode layer can be retained. Accordingly, since large area in which upper and lower electrode layers are opposite to each other can be secured, desired capacitance (at least 25 fF) of a capacitor can be obtained.

In the above mentioned another aspect of the present invention, a dose of at least any one of phosphorus and arsenic is preferably at least $2 \times 10^{15}$ cm$^{-2}$.

Since the dose is at least $2 \times 10^{15}$ cm$^{-2}$, voltage resistance which is about the same as or more than that of a capacitor having a storage node with a flat surface can be secured. Consequently, a semiconductor device suitable for higher integration degree can be obtained.

A method of manufacturing a semiconductor device in accordance with a further aspect of the present invention is a method of manufacturing a semiconductor device having a capacitor formed of a pair of electrode layers which are opposite to each other with an insulating layer therebetween, and includes the following steps.

First, a lower electrode layer of a capacitor, which has a surface with concaves and convexes, is formed of polycrystalline silicon. Then, the tips of concaves and convexes at the surface of the lower electrode layer are rounded by implanting, into the lower electrode layer, ions other than ions which produce one of a donor and an acceptor when introduced into silicon. Thereafter, an upper electrode layer is formed on the surface of the lower electrode layer with a capacitor insulating layer therebetween.

In the above mentioned further aspect of the present invention, the tips of concaves and convexes at the surface of the lower electrode layer are rounded by implanting ions other than ions which produce one of a donor and an acceptor when introduced into silicon. Therefore, concentration of an electric field on the tips of concaves and convexes is prevented. Consequently, increase in leak current between capacitor electrodes can be suppressed.

A method of manufacturing a semiconductor device in accordance with a still further aspect of the present invention is a method of manufacturing a semiconductor device having a capacitor formed of a pair of electrode layers which are opposite to each other with an insulating layer therebetween, and includes the following steps.

First, a lower electrode layer of a capacitor, which has a surface with concaves and convexes, is formed of polycrystalline silicon. Then, the tips of concaves and convexes at the surface of the lower electrode layer are rounded by implanting ions, which produce one of a donor and an acceptor when introduced into silicon, into the lower electrode layer with a dose of less than $3.0 \times 10^{15}$ cm$^{-2}$. Thereafter, an upper electrode layer is formed on the surface of the lower electrode layer with a capacitor insulating layer therebetween.

In the above mentioned still further aspect of the present invention, the tips of concaves and convexes at the surface of the lower electrode layer are rounded by implanting ions which produce one of a donor and an acceptor when introduced into silicon. Therefore, concentration of an electric field on the tips of concaves and convexes is prevented.

Consequently, increase in leak current between capacitor electrodes can be suppressed.

In addition, since ions which produce one of a donor and an acceptor when introduced into silicon are implanted with a dose of less than $3.0 \times 10^{15}$ cm$^{-2}$, a prescribed shape of concaves and convexes at the surface of the lower electrode layer can be retained. Accordingly, since large area in which the upper and the lower electrode layers are opposite to each other can be secured, desired capacitance (at least 25 fF) of a capacitor can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in conjunction with the accompanying drawings.

First Embodiment

Figure 1:
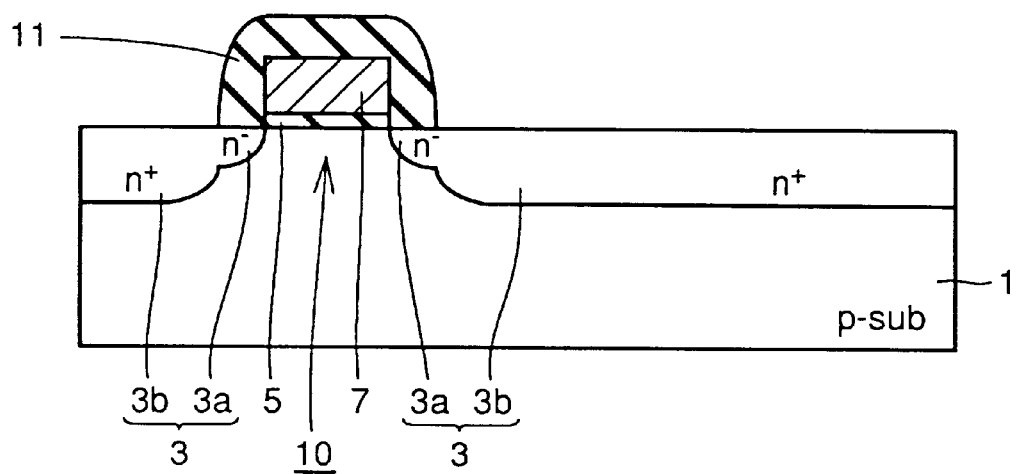
FIGS. 1 to 6 are schematic cross sections sequentially showing the steps of a method of manufacturing a semiconductor device in accordance with a first embodiment of the present invention.

Referring to FIG. 1, a patterned gate electrode layer 7 is formed on a surface of a p type silicon substrate 1 with a gate insulating layer 5 therebetween. A pair of n$^-$ impurity regions 3$a$ are formed to sandwich a region under gate electrode layer 7 therebetween by ion implantation or the like using gate electrode layer 7 as a mask. Then, an insulating layer 11 is formed to cover gate electrode layer 7. A pair of n$^+$ impurity regions 3$b$ are formed by ion implantation or the like using insulating layer 11 as a mask. An n type source/drain region 3 having an LDD structure is constituted by n$^-$ impurity region 3$a$ and n$^+$ impurity region 3$b$.

An MOS transistor 10 is constituted by the pair of n type source/drain regions 3, gate insulating layer 5 and gate electrode layer 7.

Figure 2:
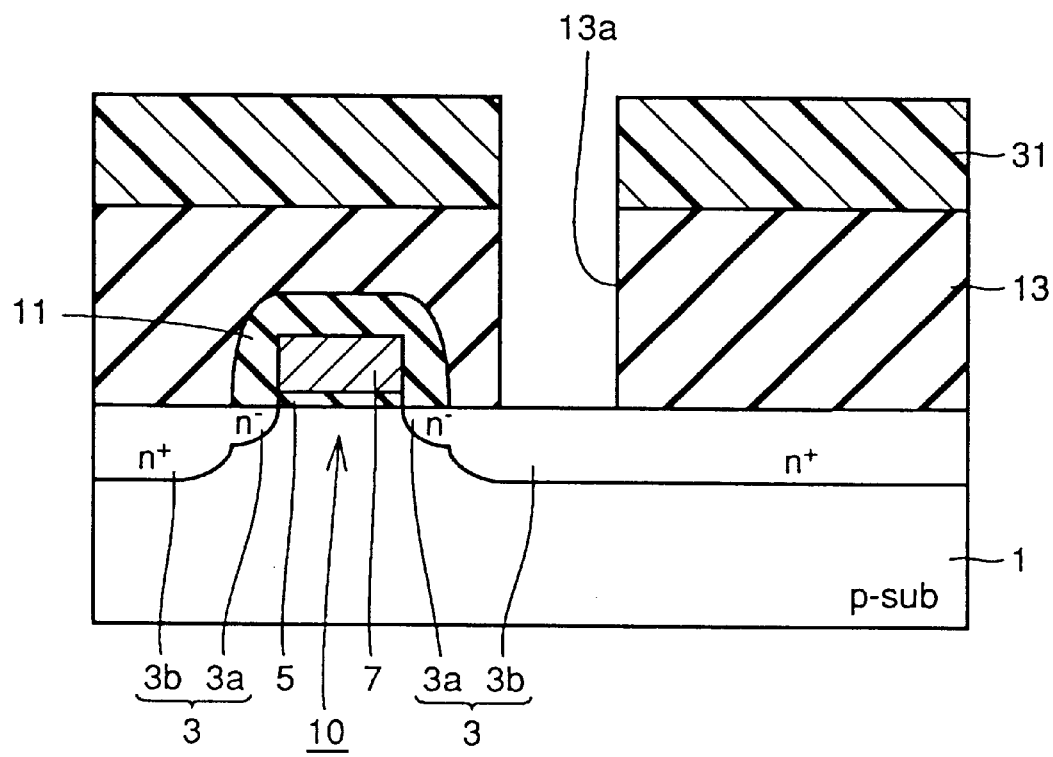

Referring to FIG. 2, an interlayer insulating layer 13 made of, for example, a silicon oxide film is formed by a CVD method with a thickness of 5000 Å so as to cover MOS transistor 10. A resist pattern 31 is formed on interlayer insulating layer 13 by normal photolithography technique. Interlayer insulating layer 13 is subject to anisotropic dry etching using resist pattern 31 as a mask. Thus, a contact hole 13$a$ reaching to a partial surface of n type source/drain region 3 is formed in interlayer insulating layer 13. Resist pattern 31 is then removed.

Figure 3:
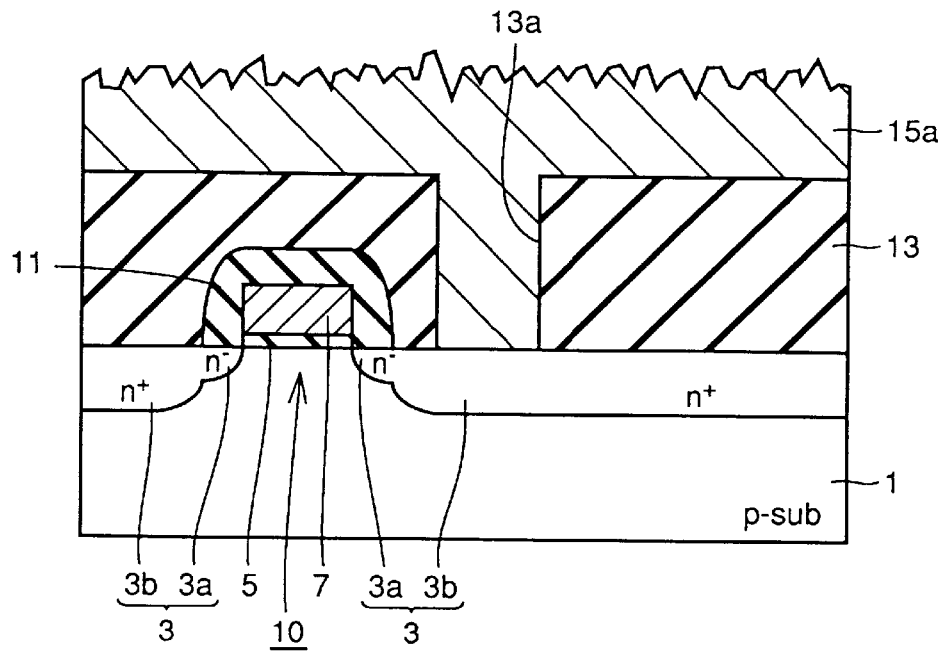

Referring to FIG. 3, a polysilicon film 15$a$ is formed to be electrically connected to n type source/drain region 3 through contact hole 13$a$ and to extend over interlayer insulating layer 13. Polysilicon film 15$a$ is formed to be rough surface polysilicon by a tube type low pressure CVD apparatus at a temperature of 575° C. and deposition pressure of 0.2 Torr. Furthermore, polysilicon film 15$a$ has a thickness of about 2000 Å.

Figure 7:
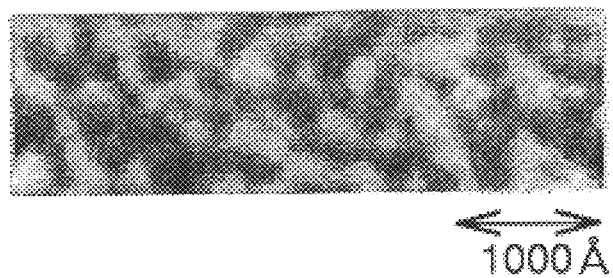
FIG. 7 shows a photograph, by an SEM (Scanning Electron Microscope), of a surface of a polysilicon film formed in the step shown in FIG. 3.

FIG. 7 shows the result of observation of a surface of polysilicon film 15$a$ with a scanning electron microscope (SEM). It can be found from FIG. 7 that fine concaves and convexes having a height of about 500 Å are formed at a surface of polysilicon. It is noted that FIG. 7 shows a condition when the surface of the polysilicon film is observed at an angle of 45° to the surface.

Figure 4:
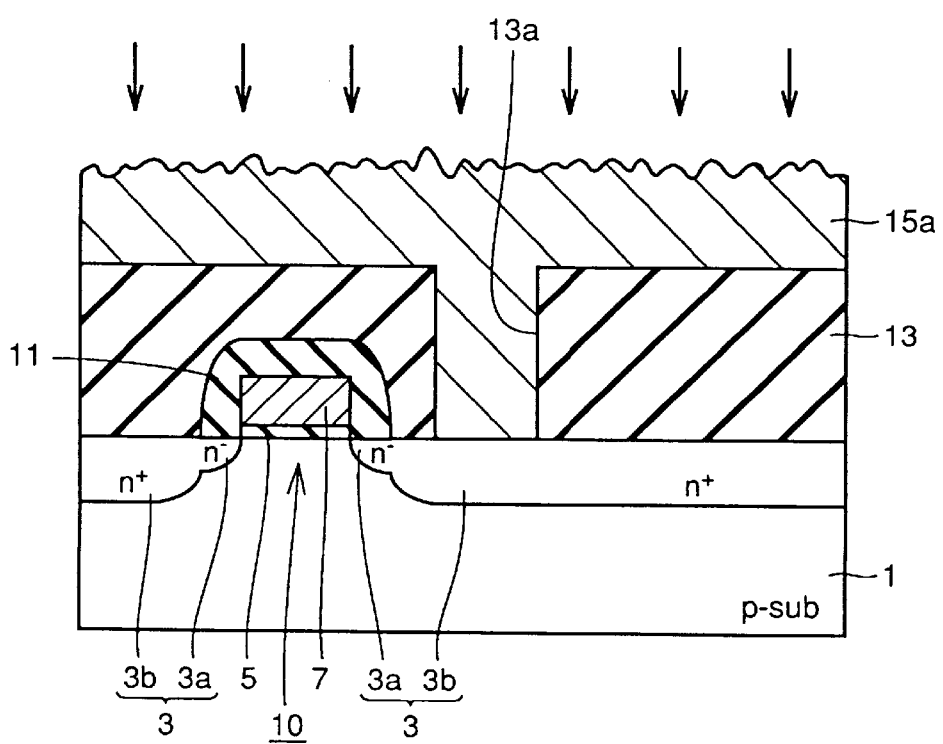

Referring to FIG. 4, ions are implanted into polysilicon film 15$a$. At this time, silicon ions which are the same material as that of the matrix are used as ion species to be implanted so that implanted ions (grains) will not affect the material of the matrix adversely. Ion implantation is carried out at an implantation energy of 50 keV and with a dose of $4 \times 10_{15}$ cm$^{-2}$.

Figure 8:
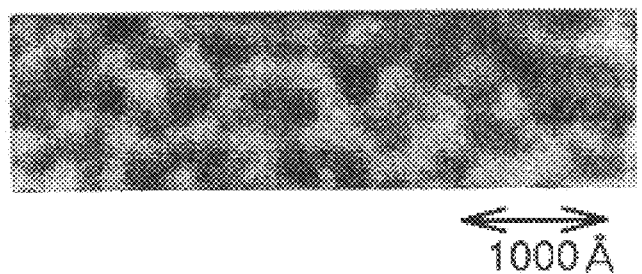
FIG. 8 shows a photograph, by the SEM, of a surface of a polysilicon film after implantation of ion species shown in FIG. 4.

FIG. 8 shows the result of observation of the surface of polysilicon film 15$a$ with an SEM after this ion implantation. As can be seen from FIG. 8, concaves and convexes at the surface of polysilicon film 15$a$ are retained, and the tips of concaves and convexes are rounded effectively compared to those of FIG. 7.

Figure 5:
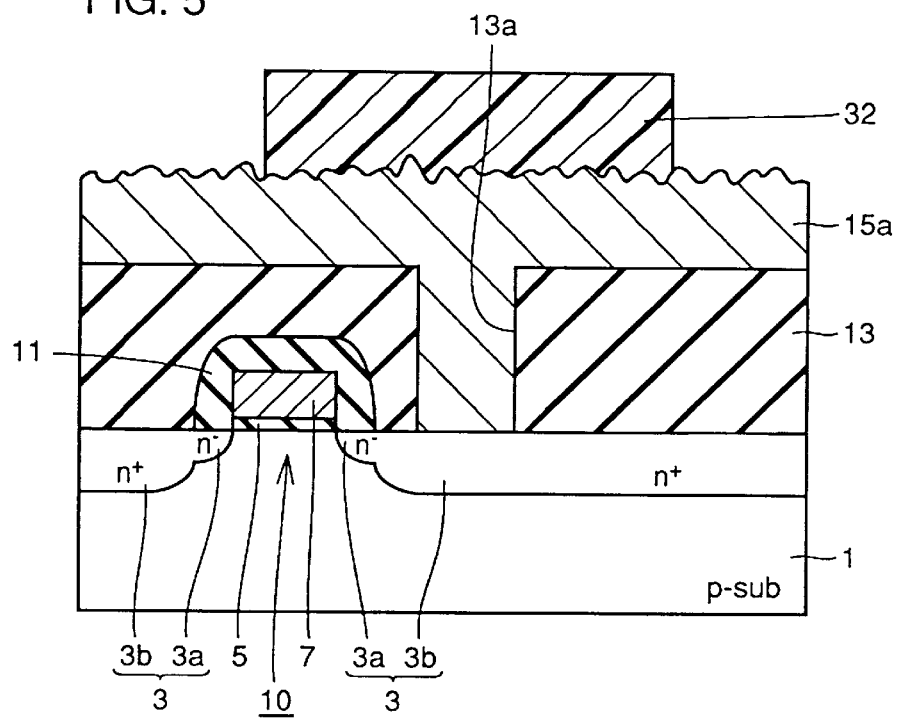

Referring to FIG. 5, a resist pattern 32 having a desired shape is formed on polysilicon film 15$a$ by normal photolithography technique. Polysilicon film 15$a$ is subject to anisotropic etching using resist pattern 32 as a mask.

Figure 6:
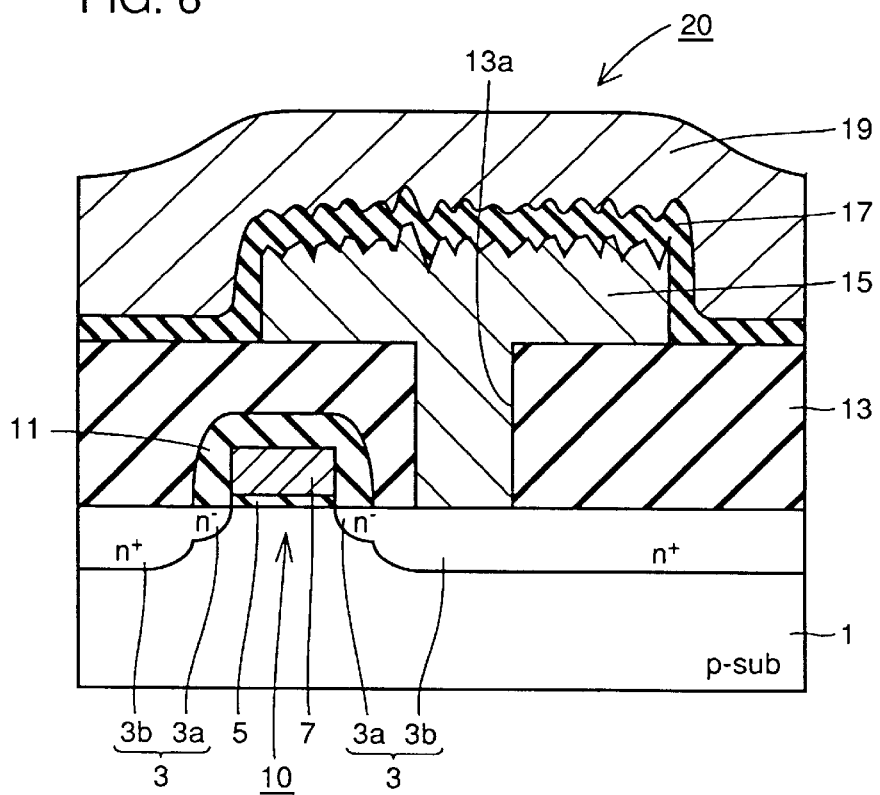

Referring to FIG. 6, a storage node 15 which is electrically connected to n type source/drain region 3 through contact hole 13$a$ and extends on the interlayer insulating layer 13 is formed by this etching. A capacitor insulating layer 17 is then formed to cover storage node 15. A cell plate 19 is formed to be opposite to storage node 15 with capacitor insulating layer 17 therebetween.

A capacitor 20 is constituted by storage node 15, capacitor insulating layer 17 and cell plate 19.

In the method of manufacturing a semiconductor device in accordance with the present embodiment, silicon ions are implanted into polysilicon film 15$a$ in the step shown in FIG. 4, so that the tips of concaves and convexes at the surface of polysilicon film 15$a$ are rounded. Accordingly, concentration of an electric field due to a shape of the surface of polysilicon film 15$a$ can be suppressed. Consequently, leak current between capacitor electrodes due to the concentration of an electric field can be suppressed.

In addition, silicon ions which are the same material as that of polysilicon film 15$a$ is used as ion species for rounding the tips of concaves and convexes of polysilicon film 15$a$. Therefore, the matrix (polysilicon film 15$a$) is prevented from being affected adversely by these ions. Thus, leak current between capacitor electrodes can be further suppressed.

Second Embodiment

In a manufacturing method in accordance with the present embodiment, phosphorus (P) is used as ion species for ion implantation performed to round concaves and convexes at a surface of a polysilicon film 15a in the step shown in FIG. 4.

Since the steps in the manufacturing method of the second embodiment are approximately the same as those of the first embodiment otherwise, description thereof will not be repeated.

Change in capacitance of a capacitor per cell with a dose of phosphorus being varied. The resultant data is shown in FIG. 9.

Figure 9:
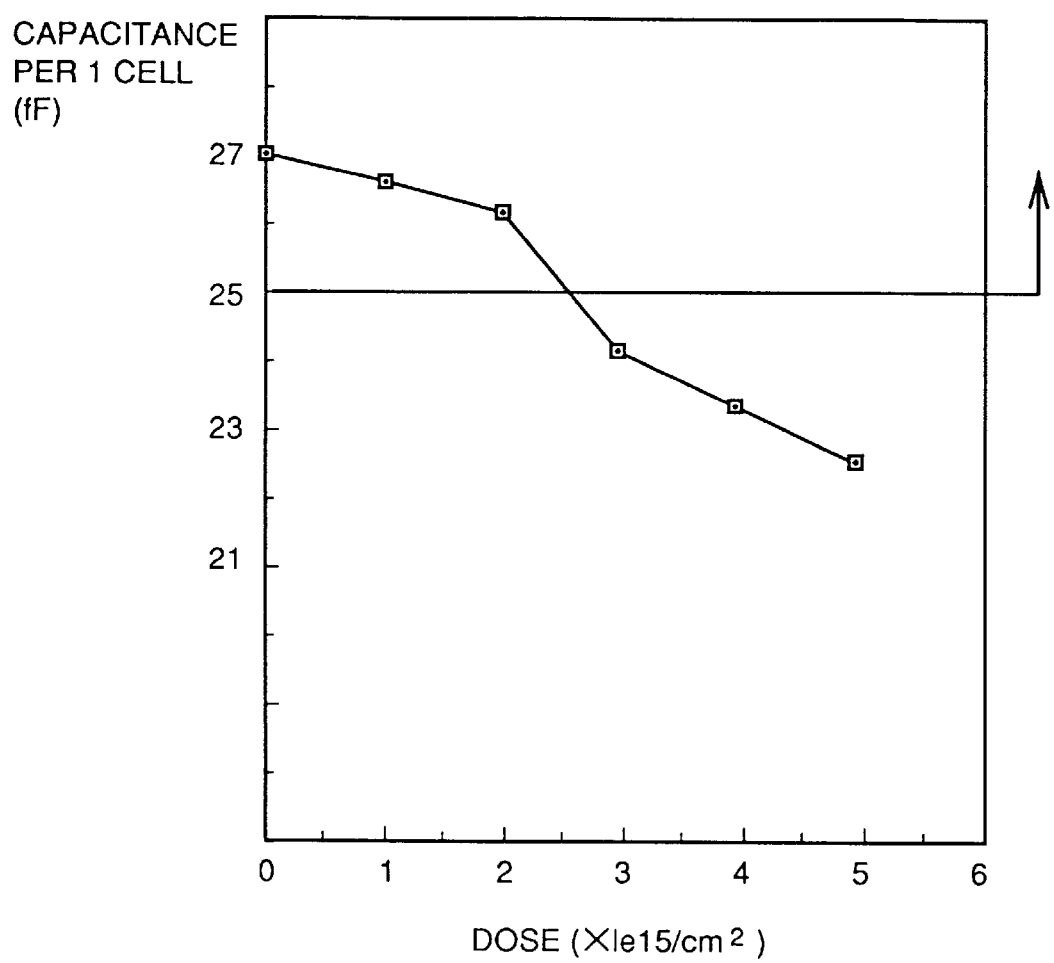
FIG. 9 is a graph showing change in capacitance of a capacitor per cell with a dose being varied.

As can be seen from FIG. 9, capacitance of a capacitor per cell is at least 25 fF if a dose thereof is less than $3.0 \times 10^{15}$ cm$^{-2}$. 25 fF is a value which is generally required as capacitance of a capacitor per cell, and a DRAM is likely to malfunction if the capacitance is less than 25 fF. Thus, it has been found that ion implantation for rounding the tips of concaves and convexes at a surface of a polysilicon film which will be a storage node must be carried out with a dose of less than $3.0 \times 10^{15}$ cm$^{-2}$ in view of operation of a DRAM.

It is noted that superior capacitance of a capacitor can be obtained if phosphorus is implanted with a dose of at most $2.5 \times 10^{15}$ cm$^{-2}$.

Figure 10:
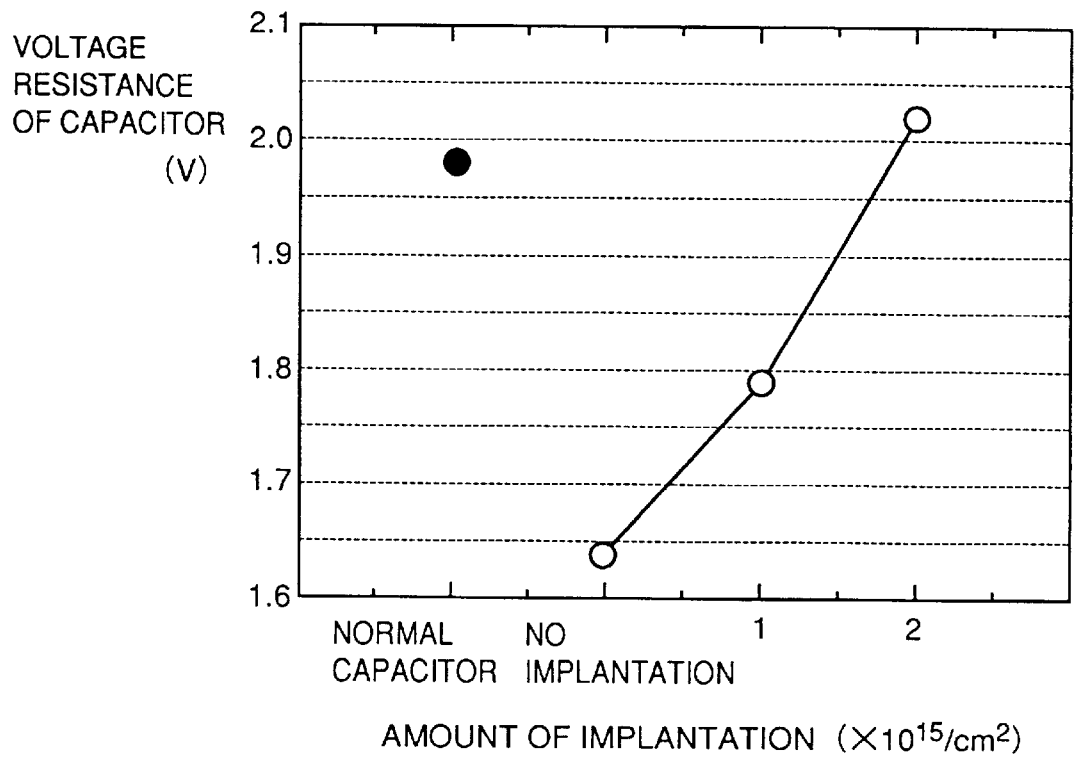
FIG. 10 is a graph showing change in voltage resistance of a capacitor with respect to a dose in the case where phosphorus is used as ion species.
Figure 11:
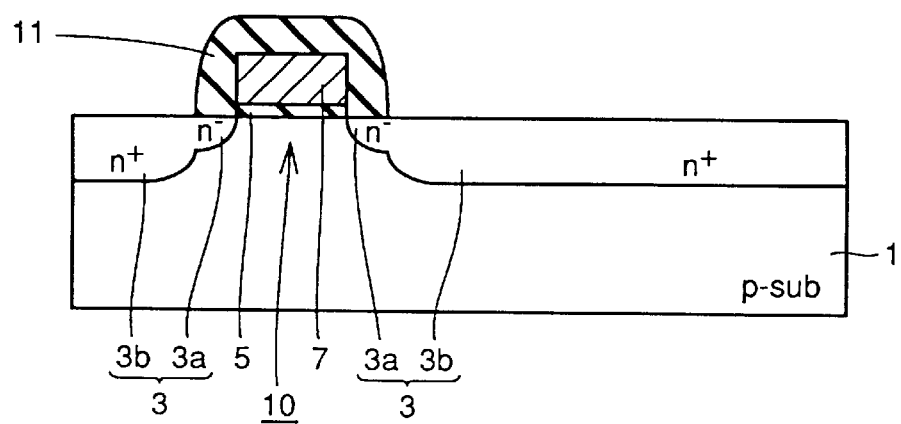
FIGS. 11 to 15 are schematic cross sections sequentially showing the steps of a conventional method of manufacturing a semiconductor device.
Figure 12:
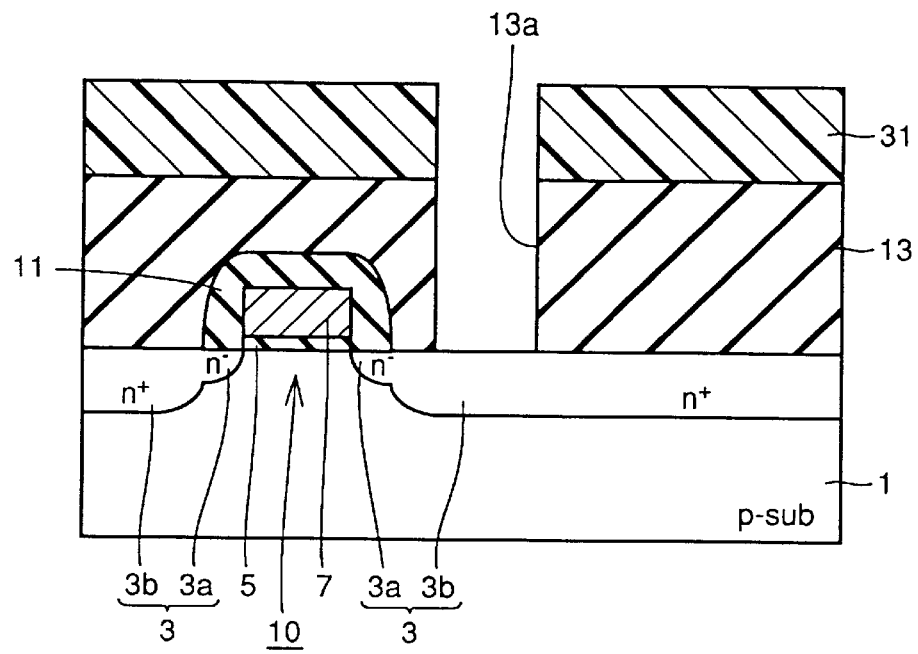
Figure 13:
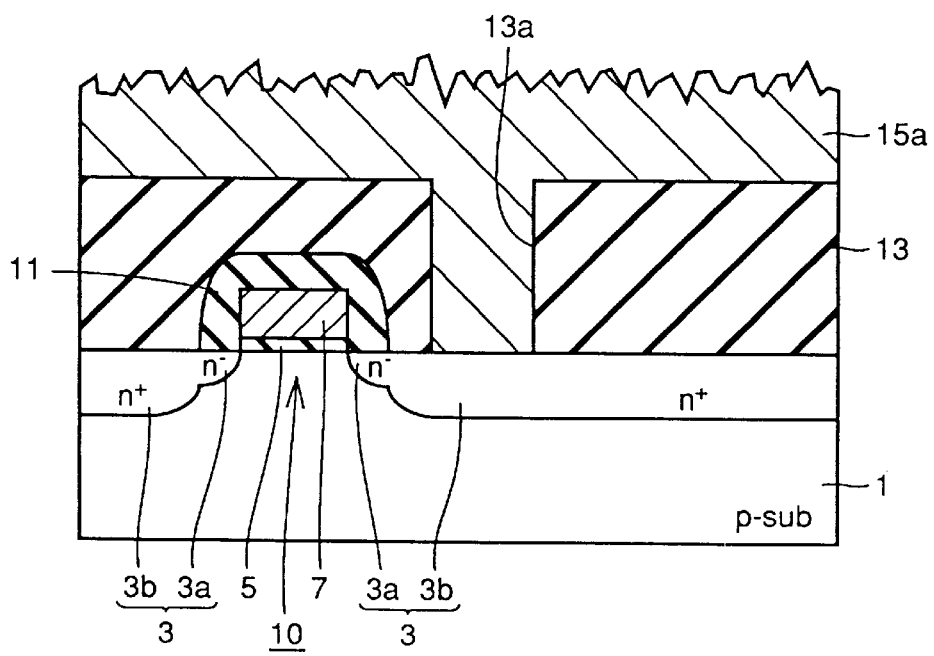
Figure 14:
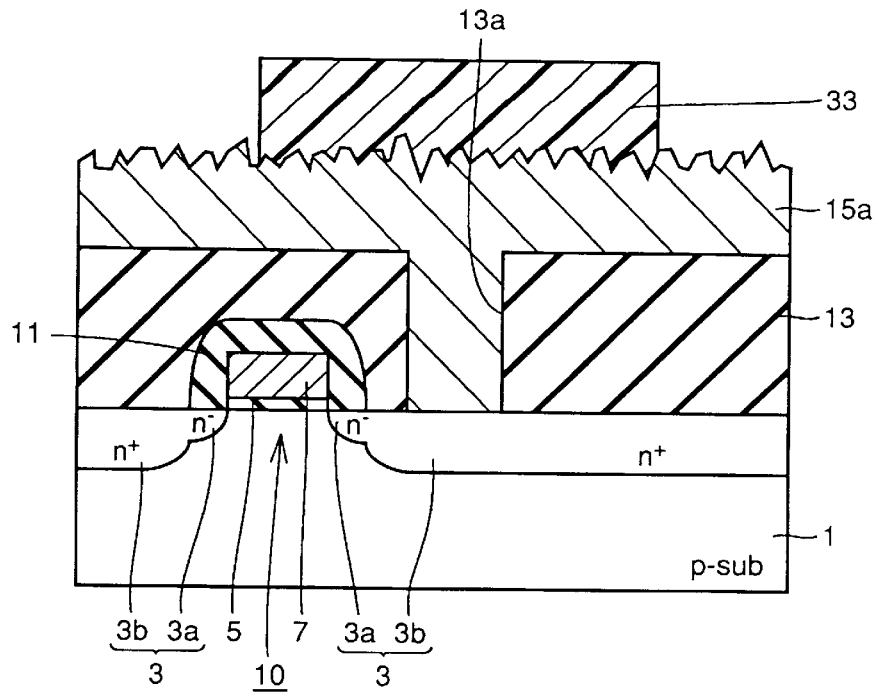
Figure 15:
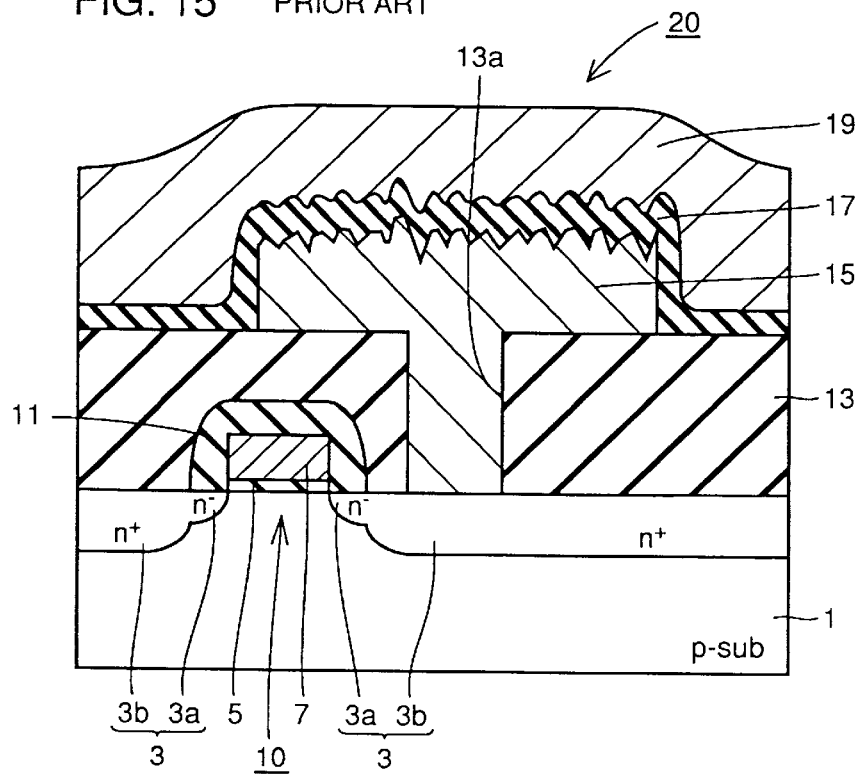
Figure 16:
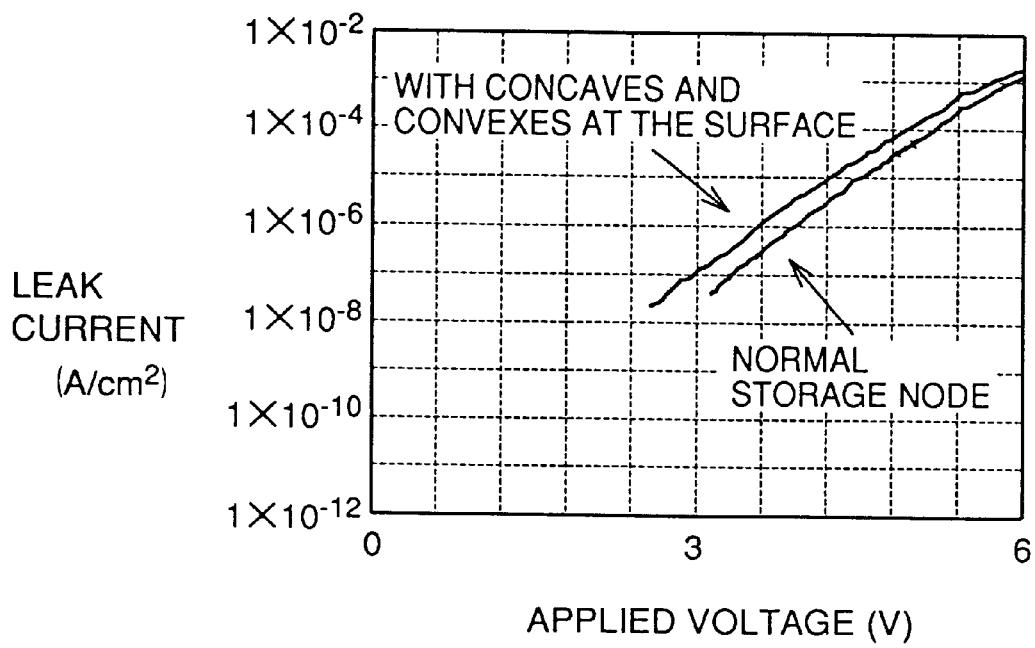
FIG. 16 is a graph showing change in leak current of a capacitor insulating layer due to difference in surface condition of polysilicon layers.
Figure 17:
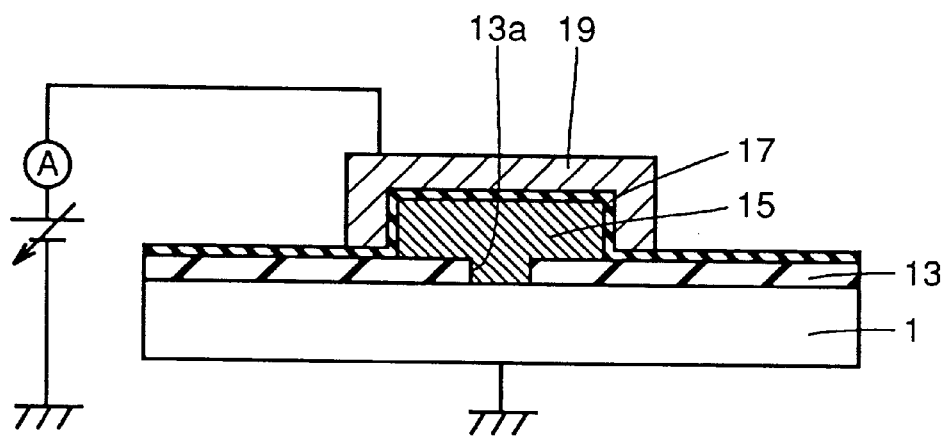
FIG. 17 is a cross section showing a structure of a sample used in measurement of leak current in a capacitor insulating layer.

On the other hand, FIG. 10 shows change in voltage resistance of a capacitor with respect to a dose of ions. It can be seen from FIG. 10 that voltage resistance of a capacitor is restored to a level equivalent to that of conventional capacitor (shown by ●) having a storage node with a smooth surface if a dose is at least $2 \times 10^{15}$ cm$^{-2}$. Thus, ion implantation to round the tips of concaves and convexes at a surface of a polysilicon film which will be a storage node must be carried out with a dose of at least $2 \times 10^{15}$ cm$^{-2}$ in view of voltage resistance of a capacitor.

Consequently, a capacitor having superior voltage resistance and superior capacitance can be obtained by performing ion implantation to round the tips of concaves and convexes at a surface of a polysilicon film which will be a storage node, with a dose in the range from $2 \times 10^{15}$ cm$^{-2}$ to less than $3 \times 10^{15}$ cm$^{-2}$.

Third Embodiment

In a method of manufacturing a semiconductor device in accordance with the present embodiment, arsenic (As) is used as ion species for ion implantation to round the tips of concaves and convexes at a surface of a polysilicon film 15a in the step shown in FIG. 4.

Since the steps in the manufacturing method of the present embodiment are approximately similar to those of the first embodiment otherwise, description thereof will not be repeated.

Since arsenic (As) used as ion species for ion implantation produces a donor when introduced into semiconductor silicon as in the case of phosphorus (P) used as ion species in the second embodiment, the same effects as those in the second embodiment can be obtained.

In addition, a capacitor having superior voltage resistance and superior capacitance can be obtained by performing ion implantation with a dose in the range from $2 \times 10^{15}$ cm$^{-2}$ to less than $3 \times 10^{15}$ cm$^{-2}$ as in the case of the second embodiment.

Fourth Embodiment

A method of manufacturing a semiconductor device in accordance with the present embodiment further includes the step of performing heat treatment, for example, at a temperature of 800° C. for thirty minutes after implantation of ion species, in the step shown in FIG. 4. The ion species implanted into a polysilicon film 15a is activated by this heat treatment, so that carrier concentration at a surface thereof increases. Thus, a property of a capacitor shown in FIG. 6 has been found to be improved.

In addition, it was confirmed that a shape of the surface of polysilicon film 15a is retained as it was even if heat treatment described above is performed.

Furthermore, the heat treatment in the present embodiment is effective particularly when phosphorus or arsenic is used as ion species as in the case of the second and the third embodiments.

Although silicon is used as ion species in the first embodiment, other ions which produce neither a donor nor an acceptor when introduced into polycrystalline silicon may be used.

Furthermore, although phosphorus and arsenic are used as ion species in the second and the third embodiments, other ions which produce a donor or an acceptor when introduced into polycrystalline silicon, may be used.

In addition, in the first to third embodiments, impurities for causing a storage node 15 to have conductivity may be introduced into a polysilicon film 15a at the same time that polysilicon film 15a is formed as shown in FIG. 3, or may be introduced thereinto before and after implantation is performed to round the tips of concaves and convexes as shown in FIG. 4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having a capacitor formed of a pair of opposite electrode layers with an insulating layer therebetween, comprising the steps of;

forming a lower electrode layer of said capacitor, which has a surface with concaves and convexes, by polycrystalline silicon;

rounding tips of said concaves and convexes at the surface of said lower electrode layer by ion implantation of silicon into said lower electrode layer; and forming an upper electrode layer on the surface of said lower electrode layer with a capacitor insulating layer therebetween.

2. A method of manufacturing a semiconductor device having a capacitor formed of a pair of opposite electrode layers with an insulating layer therebetween, comprising the steps of:

forming a lower electrode layer of said capacitor, which has a surface with concaves and convexes, by polycrystalline silicon;

rounding tips of said concaves and convexes at the surface of said lower electrode layer by implantation of ions other than ions which produce one of a donor and an acceptor when introduced into silicon; and forming an upper electrode layer on the surface of said lower electrode layer with a capacitor insulating layer therebetween.

* * * * *